United States Patent
Yamamoto et al.

(10) Patent No.: US 7,825,017 B2
(45) Date of Patent: Nov. 2, 2010

(54) METHOD OF MAKING SILICON CARBIDE SEMICONDUCTOR DEVICE HAVING MULTI-LAYERED PASSIVATION FILM WITH UNEVEN SURFACES

(75) Inventors: Takeo Yamamoto, Nishikamo-gun (JP); Takeshi Endo, Obu (JP); Eiichi Okuno, Mizuho (JP); Masaki Konishi, Toyota (JP)

(73) Assignees: DENSO CORPORATION, Kariya (JP); Toyota Jidosha Kabushiki Kaisha, Toyota (JP)

( * ) Notice: Subject to any disclaimer, the term of this patent is extended or adjusted under 35 U.S.C. 154(b) by 0 days.

(21) Appl. No.: 12/406,578

(22) Filed: Mar. 18, 2009

(65) Prior Publication Data

US 2009/0236611 A1 Sep. 24, 2009

(30) Foreign Application Priority Data

Mar. 19, 2008 (JP) ............................. 2008-071308

(51) Int. Cl.
*H01L 21/28* (2006.01)
*H01L 21/283* (2006.01)
*H01L 21/44* (2006.01)
*H01L 21/441* (2006.01)
*H01L 31/0312* (2006.01)
*H01L 29/47* (2006.01)

(52) U.S. Cl. ...................... 438/572; 438/571; 438/573; 257/77; 257/471; 257/483; 257/493; 257/496

(58) Field of Classification Search .................. 257/77; 438/571, 572, 573
See application file for complete search history.

(56) References Cited

U.S. PATENT DOCUMENTS

2006/0086939 A1* 4/2006 Carta et al. .................... 257/77
2007/0090370 A1* 4/2007 Nakayama et al. ............ 257/77
2007/0126086 A1 6/2007 Kanata et al.
2008/0237608 A1* 10/2008 Richieri ....................... 257/77

FOREIGN PATENT DOCUMENTS

JP A-60-97672 5/1985

(Continued)

OTHER PUBLICATIONS

Office Action issued from the Japanese Patent Office on Mar. 2, 2010 in the corresponding Japanese patent application No. 2008-071308 (English translation thereof).

*Primary Examiner*—N Drew Richards
*Assistant Examiner*—Michael Jung
(74) *Attorney, Agent, or Firm*—Posz Law Group, PLC (57) ABSTRACT

A silicon carbide semiconductor device provided as a semiconductor chip includes a substrate, a drift layer on the substrate, an insulation film on the drift layer, a semiconductor element formed in a cell region of the drift layer, a surface electrode formed on the drift layer and electrically coupled to the semiconductor element through an opening of the insulation film, and a passivation film formed above the drift layer around the periphery of the cell region to cover an outer edge of the surface electrode. The passivation film has an opening through which the surface electrode is exposed outside. A surface of the passivation film is made uneven to increase a length from an inner edge of the opening of the passivation film to a chip edge measured along the surface of the passivation film.

4 Claims, 6 Drawing Sheets

FOREIGN PATENT DOCUMENTS

| JP | A-60-207340 | 10/1985 |
| JP | A-63-10571 | 1/1988 |
| JP | 2001-291860 A | 10/2001 |
| JP | A-2004-349383 | 12/2004 |
| JP | A-2005-286197 | 10/2005 |
| JP | 2006-210569 A | 8/2006 |
| JP | A-2007-201247 | 8/2007 |

* cited by examiner

METHOD OF MAKING SILICON CARBIDE SEMICONDUCTOR DEVICE HAVING MULTI-LAYERED PASSIVATION FILM WITH UNEVEN SURFACES

CROSS REFERENCE TO RELATED APPLICATION

This application is based on, claims priority to and incorporates herein by reference Japanese Patent Application No. 2008-71308 filed on Mar. 19, 2008.

FIELD OF THE INVENTION

The present invention relates to a silicon carbide semiconductor device and a method of making the silicon carbide semiconductor device.

BACKGROUND OF THE INVENTION

In a silicon carbide (SiC) semiconductor device, the area of a region around the periphery of a cell (i.e., active) region can be made small, because silicon carbide has high electric field strength. Therefore, as disclosed in JP-A-2001-291860, a silicon carbide semiconductor device can have a large cell region compared to a silicon (Si) semiconductor device, when the semiconductor devices have the same chip size. This is one advantage of using silicon carbide.

However, in a silicon carbide semiconductor device in chip form, a distance from a surface electrode formed in the cell region to a chip edge is short. Therefore, when a vertical power semiconductor element such as a Schottky barrier diode is formed in the cell region, a surface discharge may occur between the surface electrode and the chip edge at the time a negative voltage such as a surge voltage is applied to the surface electrode. As a result, the power semiconductor element may be broken.

Figure 7:
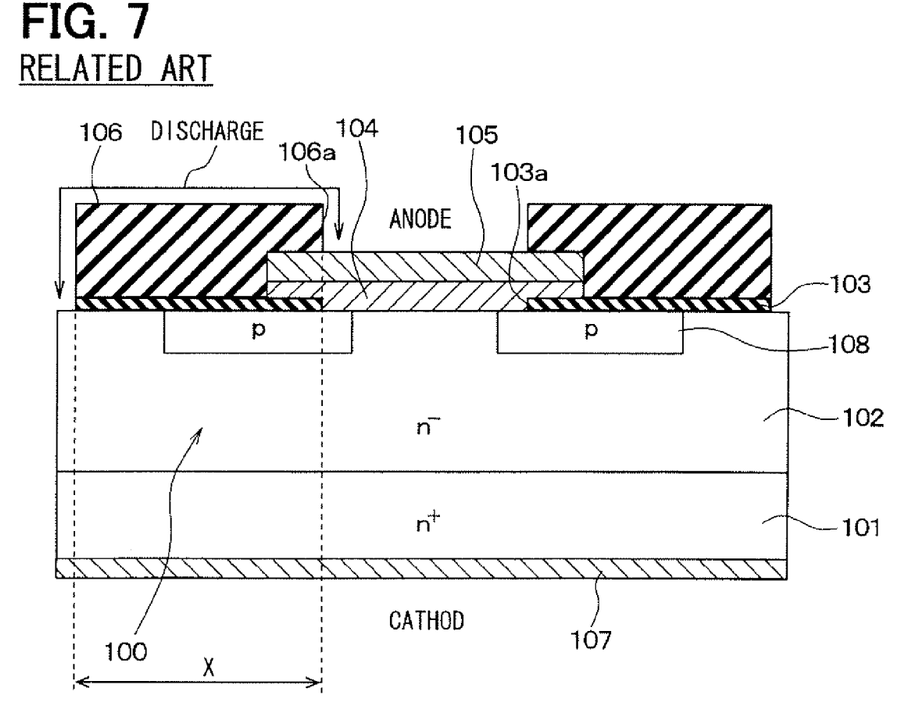
FIG. 7 is a diagram illustrating a cross-sectional view of a silicon carbide semiconductor device according to a related-art.

The surface discharge is described below with reference to FIG. 7. FIG. 7 is a diagram illustrating a cross-sectional view of a silicon carbide semiconductor device having a Schottky barrier diode (SBD) 100 formed in a cell region. As shown in FIG. 7, the semiconductor device includes a $n^+$-type substrate 101, a $n^-$-type drift layer 102 formed on a front surface of the substrate 101, an oxide film 103 formed on the drift layer 102, a Schottky electrode 104 that is in contact with the drift layer 102 through an opening 103a of the oxide film 103, and a wiring electrode 105 formed on the Schottky electrode 104. The Schottky electrode 104 and the wiring electrode 105 form an anode of the SBD 100. A p-type reduced surface field (RESURF) layer 108 is formed in a surface portion of the drift layer 102 to surround a Schottky contact region where the Schottky electrode 104 is in Schottky-contact with the drift layer 102. A back electrode 107 as a cathode of the SBD 100 is formed on a back surface of the substrate 101. A passivation film 106 is formed to cover the periphery of the Schottky electrode 104 and the wiring electrode 105. In a structure shown in FIG. 7, a surface discharge is likely to occur between the anode and a chip edge, because a distance X from an inner edge of an opening 106a of the passivation film 106 to the chip edge is short.

SUMMARY OF THE INVENTION

In view of the above, it is an object of the present invention to provide a silicon carbide semiconductor device having a vertical semiconductor element having a structure for reducing a surface discharge. It is another object of the present invention to provide a method of making the silicon carbide semiconductor device. It is further another object of the present invention to provide a semiconductor wafer to which multiple semiconductor elements are formed.

According to a first aspect of the present invention, a silicon carbide semiconductor device provided as a semiconductor chip includes a silicon carbide substrate, a first conductivity type silicon carbide drift layer, an interlayer insulation film, a semiconductor element, a surface electrode, a passivation film, and a back electrode. The substrate has front and back surfaces opposite to each other The drift layer is located on the front surface of the substrate and has an impurity concentration less than an impurity concentration of the substrate. The interlayer insulation film is located on the drift layer and has an opening. The semiconductor element is formed in a cell region of the drift layer. The surface electrode is located on the drift layer and electrically coupled to the semiconductor element through the opening of the insulation film. The passivation film is located above the drift layer around the periphery of the cell region and covers an outer edge of the surface electrode. The passivation film having an opening through which the surface electrode is exposed outside. The back electrode is located on the back surface of the substrate and electrically coupled to the semiconductor element. The passivation film has front and back sides opposite to each other. The back side is located on a surface underlying the passivation film so that the back side has a shape dependent on the underlying surface. The front side of the passivation film has an uneven surface having a shape independent of the shape of the underlying surface. A length from an inner edge of the opening of the passivation film to a chip edge measured along the uneven surface of the front side of the passivation film is greater than a length from the inner edge of the opening of the passivation film to the chip edge measured along the back side of the passivation film.

According to a second aspect of the present invention, a method of making a silicon carbide semiconductor device provided as a semiconductor chip includes forming a first conductivity type silicon carbide drift layer on a front surface of a silicon carbide substrate in such a manner that the drift layer has an impurity concentration less than an impurity concentration of the substrate, forming an interlayer insulation film on the drift layer in such a manner that the the insulation film has an opening, forming a semiconductor element in a cell region of the drift layer, forming a surface electrode on the drift layer in such a manner that the surface electrode is electrically coupled to the semiconductor element through the opening of the insulation film, forming a passivation film above the drift layer around the periphery of the cell region to cover an outer edge of the surface electrode, and forming a back electrode on a back surface opposite to the front surface of the substrate in such a manner that the back electrode is electrically coupled to the semiconductor element. The forming the passivation film includes forming an opening to the passivation film in such a manner that the surface electrode is exposed outside through the opening of the passivation film. The forming the passivation film further includes forming an uneven surface in a front side of the passivation film in such a manner that the uneven surface has a shape independent of a shape of a surface underlying the passivation film. A length from an inner edge of the opening of the passivation film to the chip edge measured along the uneven surface of the front side of the passivation film is greater than a length from the inner edge of the opening of the passivation film to the chip edge measured along a back side of the passivation film. The back side of the passivation film is placed on the surface underlying the passivation film so that the back side has a shape dependent on the underlying surface.

According to a third aspect of the present invention, a semiconductor wafer includes multiple silicon carbide semiconductor devices, each of which is provided as a semiconductor chip. Each semiconductor device includes a silicon carbide substrate, a first conductivity type silicon carbide drift layer, an interlayer insulation film, a semiconductor element, a surface electrode, a passivation film, and a back electrode. The substrate has front and back surfaces opposite to each other. The drift layer is located on the front surface of the substrate and has an impurity concentration less than an impurity concentration of the substrate. The interlayer insulation film is located on the drift layer and has an opening. The semiconductor element is formed in a cell region of the drift layer The surface electrode is located on the drift layer and electrically coupled to the semiconductor element through the opening of the insulation film. The passivation film is located above the drift layer around the periphery of the cell region and covers an outer edge of the surface electrode. The passivation film having an opening through which the surface electrode is exposed outside. The back electrode is located on the back surface of the substrate and electrically coupled to the semiconductor element. The passivation film has front and back sides opposite to each other. The back side is located on a surface underlying the passivation film so that the back side has a shape dependent on the underlying surface. The front side of the passivation film has an uneven surface having a shape independent of the shape of the underlying surface. A length from an inner edge of the opening of the passivation film to a chip edge measured along the uneven surface of the front side of the passivation film is greater than a length from the inner edge of the opening of the passivation film to the chip edge measured along the back side of the passivation film.

BRIEF DESCRIPTION OF THE DRAWINGS

The above and other objectives, features and advantages of the present invention will become more apparent from the following detailed description made with check to the accompanying drawings. In the drawings.

DETAILED DESCRIPTION OF THE PREFERRED EMBODIMENTS

Figure 8:
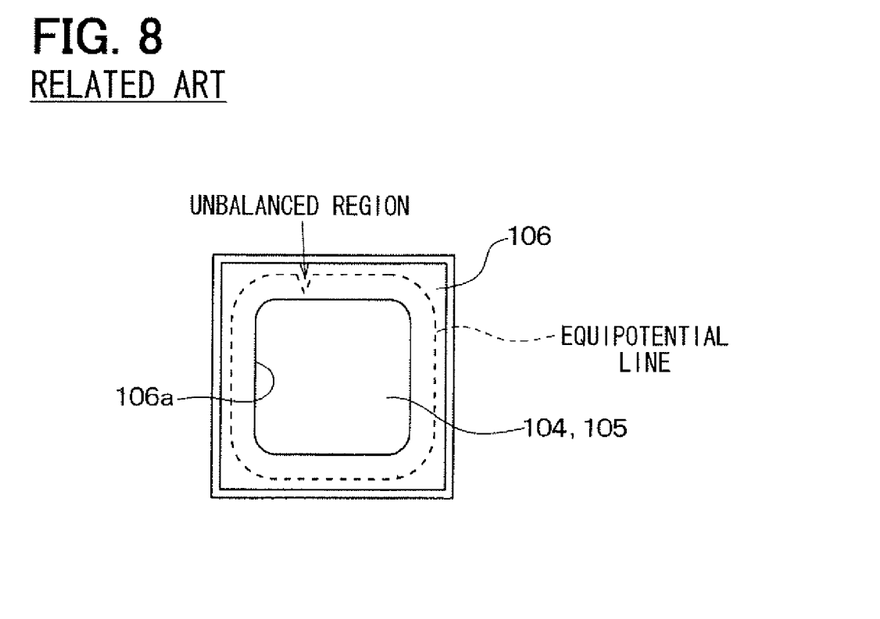
FIG. 8 is a diagram illustrating a top view of the silicon carbide semiconductor device of FIG. 7.

The present inventors have deeply studied the cause of the surface discharge of the silicon carbide semiconductor device of FIG. 7. The present inventors have found by experiment that the surface discharge results from a nonuniform electric field that is caused by the fact that an electric potential becomes unbalanced at the periphery of the chip at the time when a high voltage is applied. Specifically, as shown in FIG. 8, the electric potential becomes unbalanced at a region where the passivation film 106 is narrow, and the surface discharge occurs at the unbalanced region.

Figure 9:
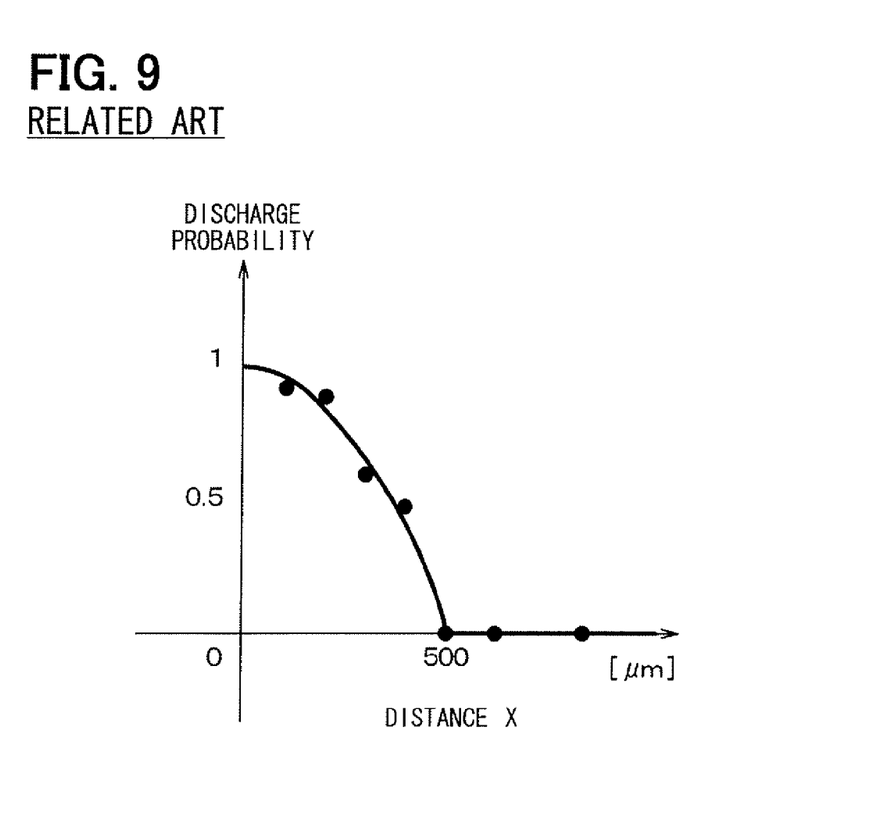
FIG. 9 is a diagram illustrating a result of an experiment conducted by the present inventors.

FIG. 9 illustrates the result of the experiment conducted by the inventors to determine a relationship between the distance X (refer to FIG. 7) and a surface discharge probability (i.e., probability of breakdown of the power semiconductor element formed in the cell region). As can be seen from FIG. 9, the surface discharge probability increases with a decrease in the distance X. When the distance X becomes less than 500 micrometers ($\mu m$), there is a possibility that the surface discharge occurs. In other words, the surface discharge can be prevented by increasing the distance X to greater than 500 $\mu m$. However, the increase in the distance X results in an increase in the area of the region around the periphery of the cell region. As a result, the advantage of using silicon carbide is lost.

First Embodiment

Figure 1:
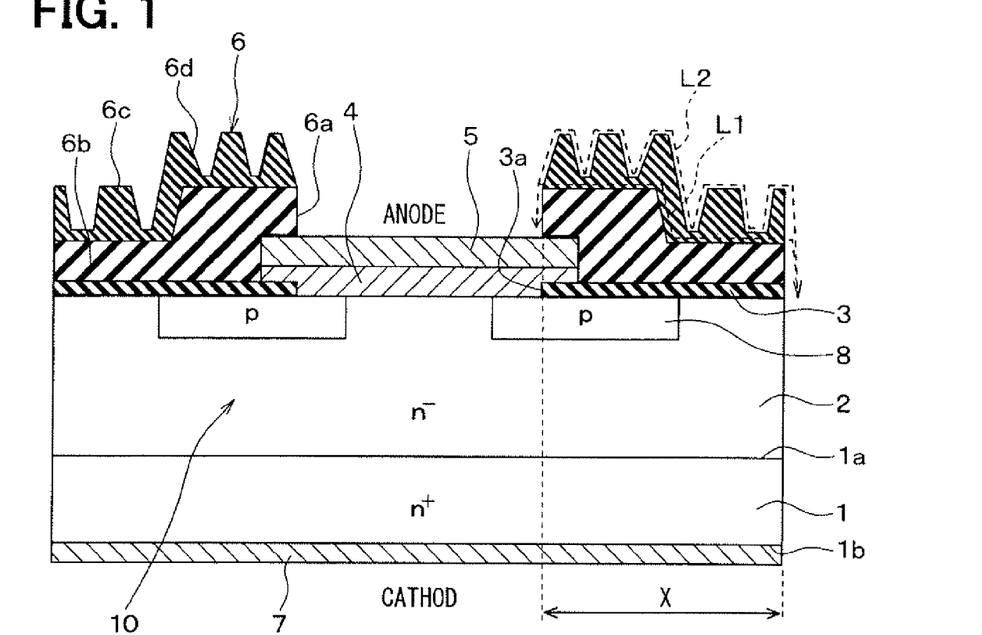
FIG. 1 is a diagram illustrating a cross-sectional view of a silicon carbide semiconductor device according to a first embodiment of the present invention.

Based on the result of the study, a first embodiment of the present invention is described below with reference to FIGS. 1 and 2A-2E. FIG. 1 illustrates a silicon carbide (SiC) semiconductor device having a vertical Schottky Barrier Diode (SBD) 10 as a vertical power semiconductor element. The SiC semiconductor device is formed using an $n^+$-type silicon carbide substrate 1 having an impurity concentration of about $2 \times 10^{18}$ $cm^{-3}$ to about $1 \times 10^{21}$ $cm^{-3}$. The substrate 1 has front and back surfaces 1a, 1b opposite to each other. A $n^-$-type silicon carbide drift layer 2 is formed on the front surface 1a of the substrate 1. An impurity concentration of the drift layer 2 is less than the impurity concentration of the substrate 1. For example, the drift layer 2 has an impurity concentration of about $1 \times 10^{15}$ $cm^{-3}$ to about $5 \times 10^{16}$ $cm^{-3}$. The SBD 10 is formed in a cell region (i.e., active region) of the substrate 1 and the drift layer 2, and a termination structure is formed around the periphery of the cell region. In this way, the silicon carbide semiconductor device is formed.

An interlayer insulation film 3 such as a silicon dioxide film is formed on a surface of the drift layer 2. The insulation film 3 has an opening 3a that is partially exposed to the cell region. A Schottky electrode 4 is formed at the opening 3a of the insulation film 3 so that the Schottky electrode 4 can be in contact with the drift layer 2 through the opening 3a. For example, the Schottky electrode 4 can be made of molybdenum (Mo), titanium (Ti), or the like. For example, the opening 3a of the insulation film 3 can have a polygonal shape (e.g., a rectangle with four rounded corners), a circular shape, or the like. The Schottky electrode 4 is in Schottky-contact with the drift layer 2 at the opening 3a. A wiring electrode 5 is formed on a surface of the Schottky electrode 4. For example, the wiring electrode 5 can be made of aluminum (Al). The Schottky electrode 4 and the wiring electrode 5 form a surface electrode acting as an anode of the SBD 10. For example, a bonding wire (not shown) is electrically connected to the wiring electrode 5 to apply a voltage to the Schottky electrode 4.

A passivation film 6 is formed on a surface of the insulation film 3 to cover outer edges of the Schottky electrode 4 and the wiring electrode 5. For example, the passivation film 6 can be an imide-based organic insulation film (e.g., a polyimide film), a nitride film, or the like. An opening 6a is formed substantially in the center of the passivation film 6. The wiring electrode 5 is exposed outside through the opening 6a so that the wiring electrode 5 can be electrically connected to the bonding wire (not shown) or the like.

In the embodiment, the passivation film 6 has a double-layer structure. Specifically, the passivation film 6 includes a first film layer 6b and a second film layer 6c. The first film layer 6b is formed by deposition or the like. The second film layer 6c is formed on the first film layer 6b by deposition or the like. After the second film layer 6c is formed on the first film layer 6b, a surface of the second film layer 6c is treated so that the second film layer 6c can have an uneven surface 6d with projections or recesses. As shown in FIG. 1, the uneven surface 6d of the passivation film 6 has a comb-shape in cross-section taken along a straight line passing through the cell region and extending from the inner edge of the opening 6a of the passivation film 6 to the chip edge.

That is, the first film layer 6b inherits its shape from a surface underlying the first film layer 6b. Specifically, the shape of the first film layer 6b is dependent on shapes of the surfaces of the insulation film 3 and the wiring electrode 5. More specifically, the surface of the first film layer 6b is shaped to follow the shapes of the surfaces of the insulation film 3 and the wiring electrode 5.

In contrast to the first film layer 6b, the second film layer 6c does not inherit its shape from a surface underlying the second film layer 6c. Specifically, the shape of the second film layer 6c is independent of the shape of the surface of the first film layer 6b. More specifically, the uneven surface 6d of the second film layer 6c does not follow the shape of the surface of the first film layer 6b.

Therefore, the second film layer 6c has a surface area larger than a surface area of the first film layer 6b. Accordingly, a length L2 from the inner edge of the opening 6a of the passivation film 6 to the chip edge along the uneven surface 6d of the second film layer 6c is greater than a length L1 from the inner edge of the opening 6a to the chip edge along the surface of the first film layer 6b.

A back electrode 7 is formed on the back surface 1b of the substrate 1 and in contact with the back surface 1b. For example, the back electrode 7 is made of titanium (Ti), molybdenum (Mo), nickel (Ni), tungsten (W), or the like. The back electrode 7 acts as a cathode of the SBD 10. In this way, the SBD 10 is formed.

A p-type reduced surface field (RESURF) layer 8 as a termination structure is formed around the periphery of the SBD 10. Specifically, the RESURF layer 8 is formed in a surface portion of the drift layer 2 to be in contact with an outer region of the Schottky electrode 4 and extends radially, outward from the outer region of the Schottky electrode 4. For example, the RESURF layer 8 can contain aluminum as an impurity and have an impurity concentration of about $5 \times 16^{16}$ $cm^{-3}$ to about $1 \times 10^{18}$ $cm^{-3}$. The RESURF layer 8 allows an electric field to spread around the periphery of the SBD 10. Thus, an electric field concentration is relieved so that the SBD 10 can have an improved resistance to breakdown.

As noted previously, the surface discharge occurs between the anode of the SBD 10 and the chip edge through the opening 6a of the passivation film 6. Specifically, the surface discharge occurs along the surface of the passivation film 6. Therefore, the surface discharge can be reduced by increasing the length between the inner edge of the opening 6a of the passivation film 6 to the chip edge along the surface of the passivation film 6.

According to the first embodiment, the passivation film 6 has the uneven surface 6d having a comb shape. In such an approach, the length L2 from the inner edge of the opening 6a of the passivation film 6 to the chip edge along the surface of the passivation film 6 is increased compared to when the passivation film 6 does not have the uneven surface 6d. In other words, the length L2 from the inner edge of the opening 6a of the passivation film 6 to the chip edge along the surface of the passivation film 6 is increased compared to when the passivation film 6 inherits its shape from the underlying surface of the passivation film 6. As a result, the surface discharge is less likely to occur so that the breakdown of the SBD 10 due to the surface discharge can be reduced.

Further, according to the first embodiment, the length L2 from the inner edge of the opening 6a of the passivation film 6 to the chip edge along the surface of the passivation film 6 is increased without increasing the distance X. Therefore, the surface discharge can be reduced without increasing the area of the region around the periphery of the cell region. Thus, the surface discharge can be reduced without losing the advantage of using silicon carbide.

An example of a method of making the SiC semiconductor device shown in FIG. 1 is described below with reference to FIGS. 2A-2E.

Figure 2A:
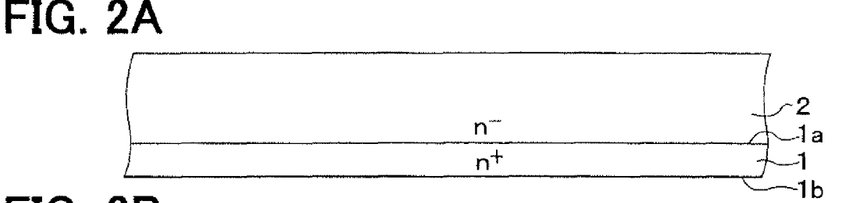
FIGS. 2A-2E are diagrams illustrating a method of making the silicon carbide semiconductor device of FIG. 1.

Firstly, in a process shown in FIG. 2A, the $n^-$-type silicon carbide drift layer 2 is epitaxially grown on the front surface 1a of the $n^+$-type silicon carbide substrate 1.

Figure 2B:
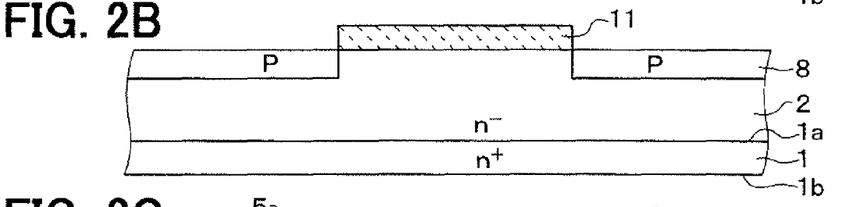

Next, in a process shown in FIG. 2B, a layer of low temperature oxide (LTO) or the like is deposited on the drift layer 2 to form a mask 11. Then, an opening is formed by photolithography in the mask 11 at a portion corresponding to the RESURF layer 8. Then, ion implantation of p-type impurity such as aluminum (Al) is performed using the mask 11. Then, activation is performed, for example, by thermal treatment so that the RESURF layer 8 can be formed.

Figure 2C:
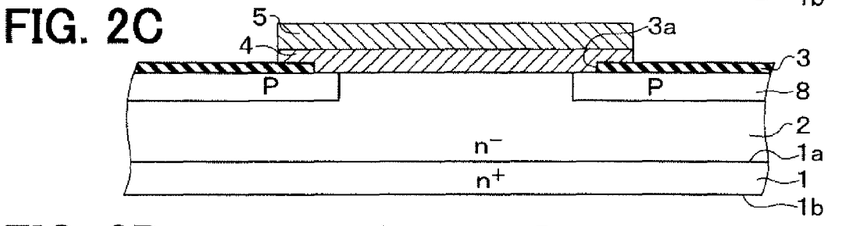

Next, in a process shown in FIG. 2C, the mask 11 is removed, and then a silicon oxide film is formed by, for example, plasma chemical vapor deposition (CVD). Then, reflow treatment is applied to the silicon oxide film to form the insulation film 3. Then, photolithography and etching are performed to form the opening 3a in the insulation film 3. Then, a metal layer made of, for example, molybdenum (Mo) or titanium (Ti) is formed on the insulation film 3 and in the opening 3a. Then, the metal layer is patterned to form the Schottky electrode 4. Then, a metal layer made of, for example, aluminum (Al) is formed on the insulation film 3 and the Schottky electrode 4, and then patterned to form the wiring electrode 5.

Figure 2D:
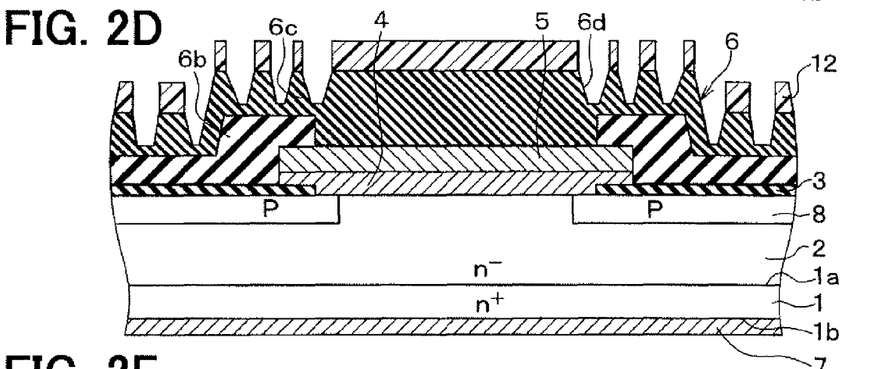

Next, in a process shown in FIG. 2D, the passivation film 6 is formed on the insulation film 3 and the wiring electrode 5. Specifically, the first film layer 6b such as an imide-based organic insulation film (e.g., a polyimide film) or a nitride film is formed on the insulation film 3 and the wiring electrode 5, and then the second film layer 6c such as an imide-based organic insulation film (e.g., a polyimide film) or a nitride film is formed on the first film layer 6b. The first and second film layers 6b, 6c can be made of the same material. Alternatively, the first and second film layers 6b, 6c can be made of different materials. Then, a mask 12 having an opening corresponding to the uneven surface 6d is formed on the second film layer 6c. Then, anisotropic etching is performed using the mask 12 so that the second film layer 6c can have the uneven surface 6d.

Figure 2E:
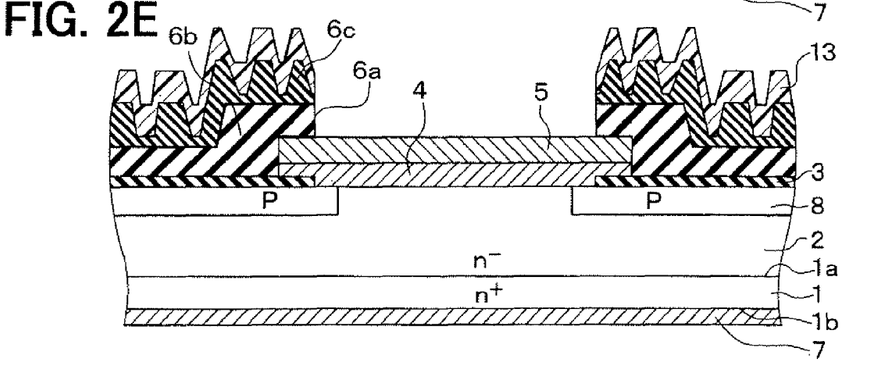

Next, in a process shown in FIG. 2E, the mask 12 is removed, and then a mask 13 having an opening corresponding to the opening 6a of the passivation film 6 is formed. Then, anisotropic etching is performed using the mask 13 so that the passivation film 6 can have the opening 6a, through which the wiring electrode 5 is exposed.

Finally, the mask 13 is removed, and a metal layer made of, for example, nickel(Ni), titanium (Ti), molybdenum (Mo), or tungsten (W) is formed on the back surface 1b of the substrate 1 to form the back electrode 7. Then, dicing cut is performed so that the SiC semiconductor device in chip form can be made.

Second Embodiment

A SiC semiconductor device according to a second embodiment of the present invention is described below with reference to FIGS. 3, 4A, and 4B. A difference between the first and second embodiments is as follows.

Figure 3:
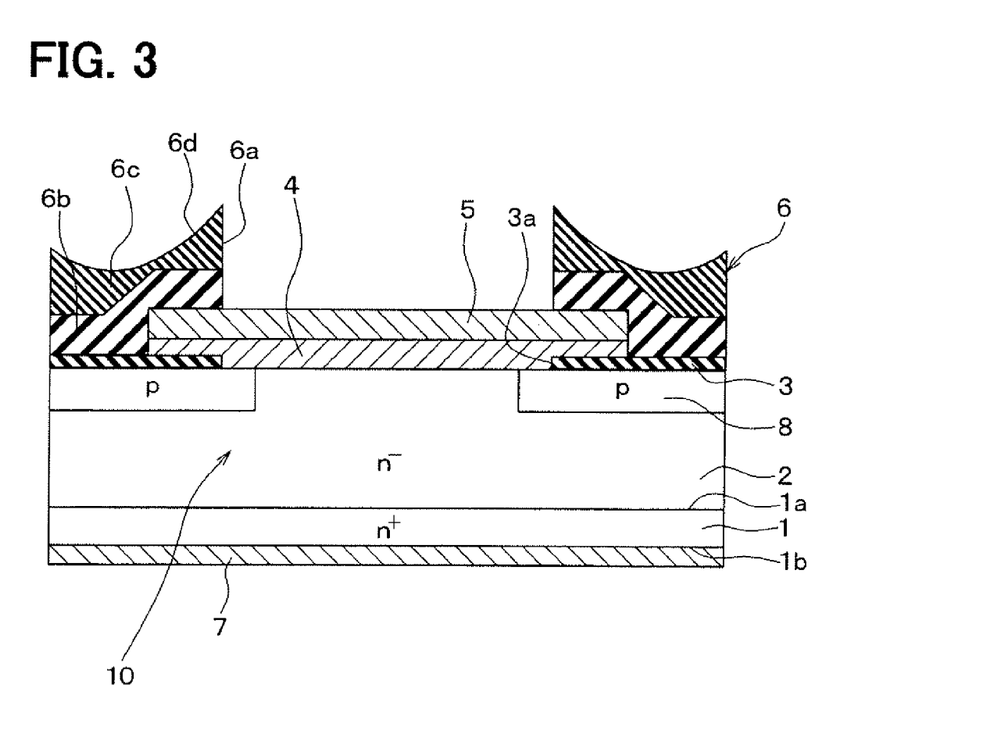
FIG. 3 is a diagram illustrating a cross-sectional view of a silicon carbide semiconductor device according to a second embodiment of the present invention.

In the second embodiment, as shown in FIG. 3, an uneven surface 6d of the passivation film 6 has a recessed shape in cross-section taken along a straight line passing through the cell region and extending from the inner edge of the opening 6a of the passivation film 6 to the chip edge. Specifically, the uneven surface 6d of the passivation film 6 is recessed entirely from the inner edge of the opening 6a of the passivation film 6 to the chip edge so that the recessed shape is constructed with one recess and two projections. The two projections are located on each side of the recess and project with respect to the recess.

According to the second embodiment, the passivation film 6 has the uneven surface 6d having a recessed shape. In such an approach, the length from the inner edge of the opening 6a of the passivation film 6 to the chip edge along the surface of the passivation film 6 is increased compared to when the passivation film 6 does not have the uneven surface 6d. Therefore, the SiC semiconductor device of the second embodiment can have the same advantage as the SiC semiconductor device of the first embodiment.

An example of a method of making the SiC semiconductor device shown in FIG. 3 is described below with reference to FIGS. 4A and 4B.

Firstly, as described in the first embodiment, in the processes shown in FIGS. 2A-2C, the RESURF layer 8 is formed in the drift layer 2 on the front surface 1a of the substrate 1, and then the insulation film 3, the Schottky electrode 4, the wiring electrode 5 are formed on the drift layer 2.

Figure 4A:
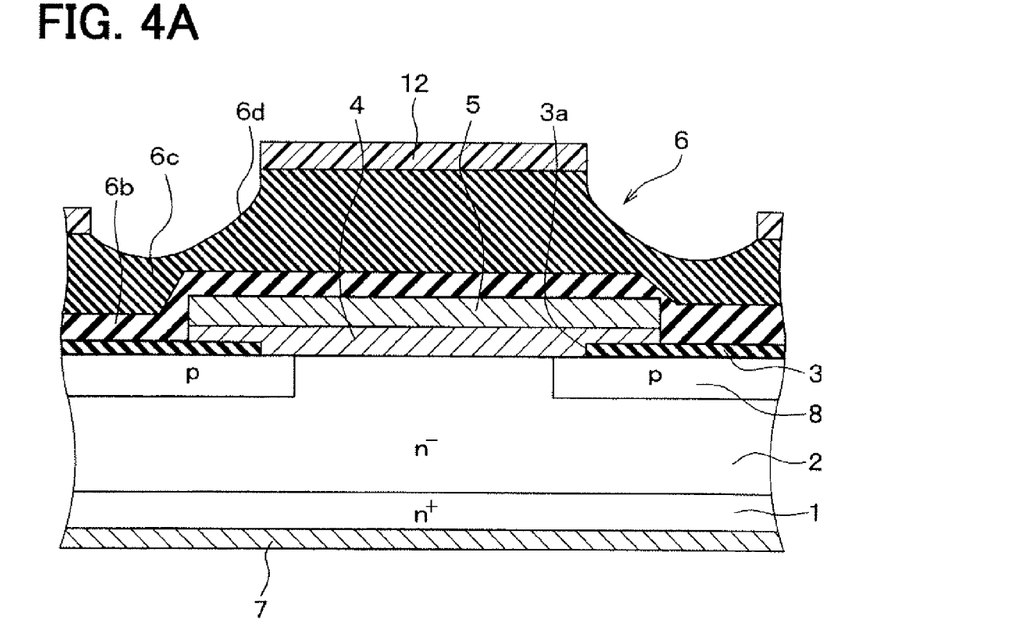
FIGS. 4A and 4B are diagrams illustrating a method of making the silicon carbide semiconductor device of FIG. 3.
Figure 4B:
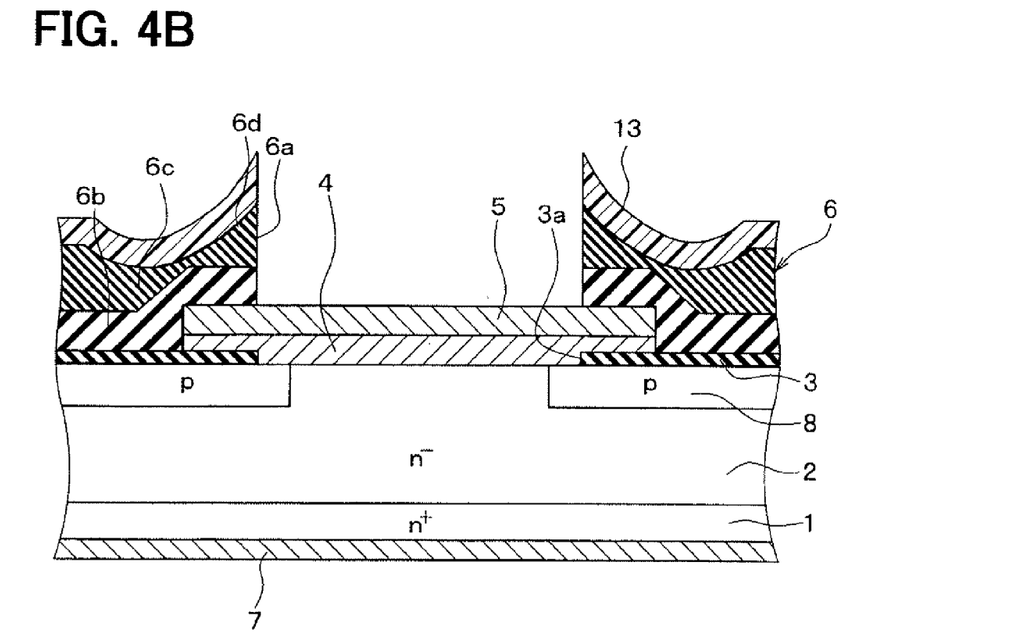

Next, in a process shown in FIG. 4A, the passivation film 6 is formed on the insulation film 3 and the wiring electrode 5. Specifically, the first film layer 6b such as an imide-based organic insulation film (e.g., a polyimide film) or a nitride film is formed on the insulation film 3 and the wiring electrode 5, and then the second film layer 6c such as an imide-based organic insulation film (e.g., a polyimide film) or a nitride film is formed on the first film layer 6b. Then, a mask 12 having an opening corresponding to the uneven surface 6d is formed on the second film layer 6c. Then, wet etching is performed using the mask 12 so that the second film layer 6c can have the uneven surface 6d.

Next, in a process shown in FIG. 4D, the mask 12 is removed, and then a mask 13 having an opening corresponding to the opening 6a of the passivation film 6 is formed. Then, anisotropic etching is performed using the mask 13 so that the passivation film 6 can have the opening 6a, through which the wiring electrode 5 is exposed.

Finally, the mask 13 is removed, and a metal layer made of, for example, nickel(Ni), titanium (Ti), molybdenum (Mo), or tungsten (W) is formed on the back surface 1b of the substrate 1 to form the back electrode 7. Then, dicing cut is performed so that the SiC semiconductor device in chip form can be made.

Third Embodiment

A SiC semiconductor device according to a third embodiment of the present invention is described below with reference to FIGS. 5, 6A, and 6B. A difference between the first and third embodiments is as follows.

Figure 5:
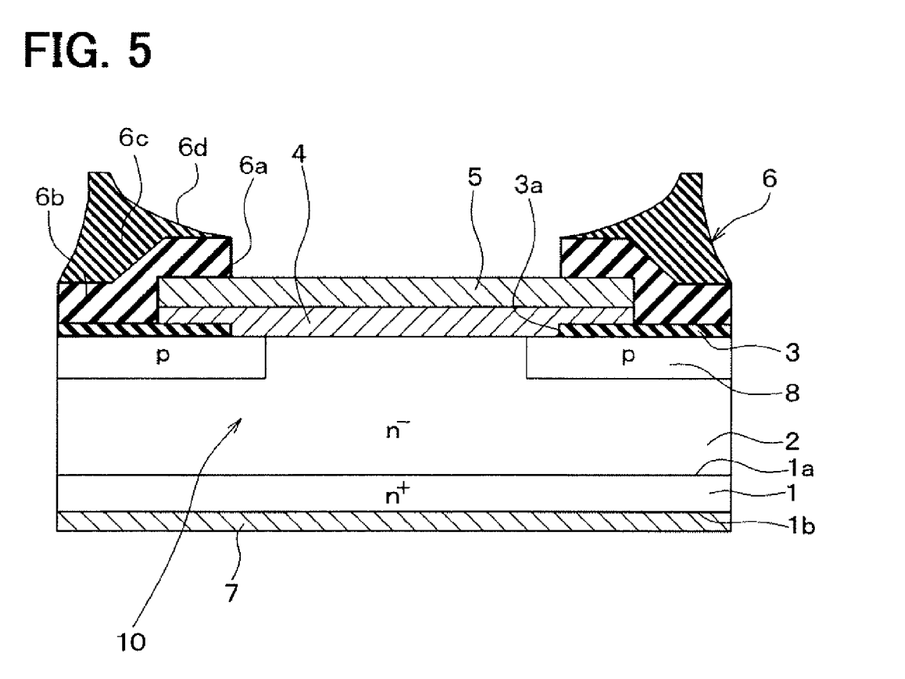
FIG. 5 is a diagram illustrating a cross-sectional view of a silicon carbide semiconductor device according to a third embodiment of the present invention.

In the third embodiment, as shown in FIG. 5, an uneven surface 6d of the passivation film 6 has a projecting shape in cross-section taken along a straight line passing through the cell region and extending from the inner edge of the opening 6a of the passivation film 6 to the chip edge. Specifically, the uneven surface 6d of the passivation film 6 projects entirely from the inner edge of the opening 6a of the passivation film 6 to the chip edge so that the projecting shape is constructed with one projection and two recesses. The two recesses are located on each side of the projection and are recessed with respect to the projection.

According to the third embodiment, the passivation film 6 has the uneven surface 6d having a projecting shape. In such an approach, the length from the inner edge of the opening 6a of the passivation film 6 to the chip edge along the surface of the passivation film 6 is increased compared to when the passivation film 6 does not have the uneven surface 6d. Therefore, the SiC semiconductor device of the third embodiment can have the same advantage as the SiC semiconductor device of the first embodiment.

An example of a method of making the SiC semiconductor device shown in FIG. 5 is described below with reference to FIGS. 6A and 6B.

Firstly, as described in the first embodiment, in the processes shown in FIGS. 2A-2C, the RESURF layer 8 is formed in the drift layer 2 on the front surface 1a of the substrate 1, and then the insulation film 3, the Schottky electrode 4, the wiring electrode 5 are formed on the drift layer 2.

Figure 6A:
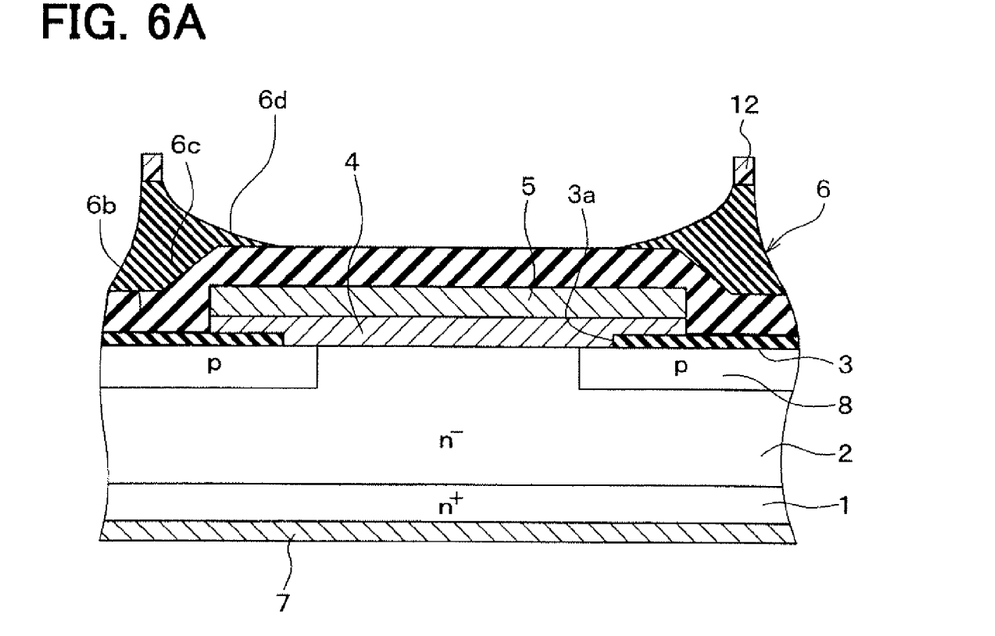
FIGS. 6A and 6B are diagrams illustrating a method of making the silicon carbide semiconductor device of FIG. 5.

Next, in a process shown in FIG. 6A, the passivation film 6 is formed on the insulation film 3 and the wiring electrode 5. Specifically, the first film layer 6b such as an imide-based organic insulation film (e.g., a polyimide film) or a nitride film is formed on the insulation film 3 and the wiring electrode 5, and then the second film layer 6c such as an imide-based organic insulation film (e.g., a polyimide film) or a nitride film is formed on the first film layer 6b. Then, a mask 12 having an opening corresponding to the uneven surface 6d is formed on the second film layer 6c. Then, wet etching is performed using the mask 12 so that the second film layer 6c can have the uneven surface 6d.

Figure 6B:
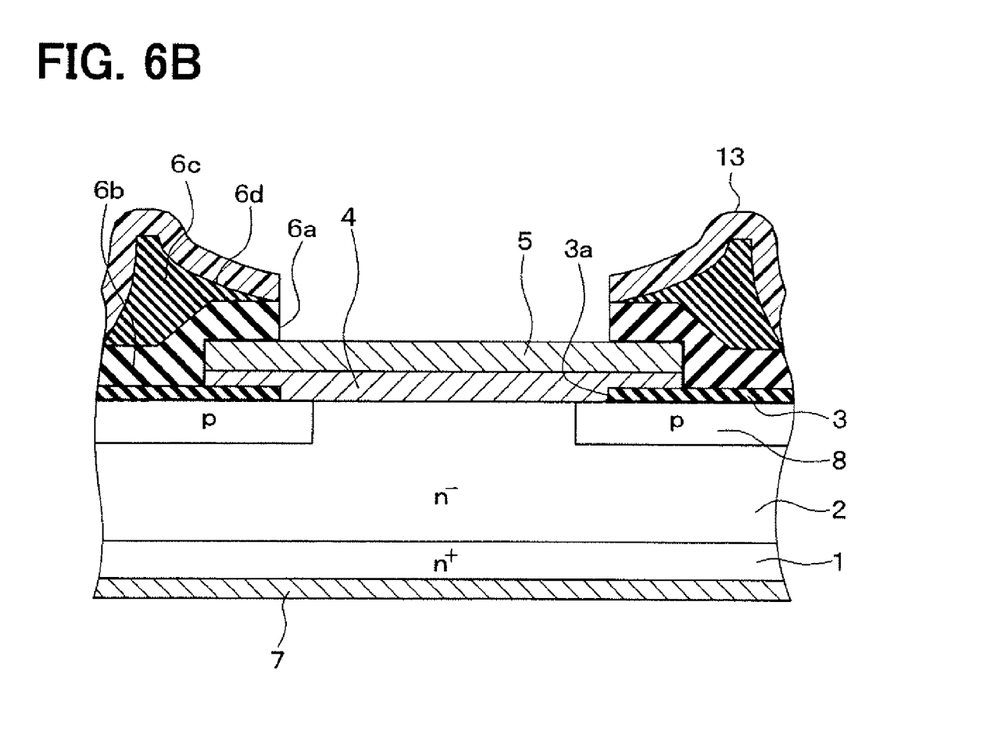

Next, in a process shown in FIG. 6B, the mask 12 is removed, and then a mask 13 having an opening corresponding to the opening 6a of the passivation film 6 is formed. Then, anisotropic etching is performed using the mask 13 so that the passivation film 6 can have the opening 6a, through which the wiring electrode 5 is exposed.

Finally, the mask 13 is removed, and a metal layer made of, for example, nickel(Ni), titanium (Ti), molybdenum (Mo), or tungsten (W) is formed on the back surface 1b of the substrate 1 to form the back electrode 7. Then, dicing cut is performed so that the SiC semiconductor device in chip form can be made.

MODIFICATIONS

The embodiments described above can be modified in various ways. For example, the passivation film 6 can be formed to have a single-layer structure.

When the passivation film 6 is formed to have a double-layer structure, it is preferable that the first film layer 6b and the second film layer 6c be made of different materials. In such an approach, etching of the second film layer 6c can be performed by using the first film layer 6b as a stopper layer.

The insulation film 3 underlying the passivation film 6 can be omitted, as long as the Schottky electrode 4 can be in Schottky-contact with the drift layer 2.

A guard ring layer can be formed to surround the periphery of the RESURF layer 8 to provide a termination structure.

A vertical power semiconductor element other than a Schottky barrier diode can be formed in the cell region of the SiC semiconductor device, as long as the vertical power semiconductor element has electrodes on the front and back surfaces 1a, 1b of the substrate 1. For example, a vertical metal-oxide semiconductor field-effect transistor (MOSFET), a vertical insulated gate bipolar transistor (IGBT), or a vertical junction field-effect transistor (JFET) can be formed in the cell region of the SiC semiconductor device.

The present invention can be applied to a semiconductor wafer to which multiple semiconductor devices according to the embodiments are formed.

Such changes and modifications are to be understood as being within the scope of the present invention as defined by the appended claims.

What is claimed is:

1. A method of making a silicon carbide semiconductor device provided as a semiconductor chip having a chip edge, the method comprising:
   forming a first conductivity type silicon carbide drift layer on a front surface of a silicon carbide substrate, the drift layer having an impurity concentration less than an impurity concentration of the substrate;
   forming an interlayer insulation film on the drift layer, the forming the insulation film including forming an opening in the insulation film;
   forming a semiconductor element in a cell region of the drift layer;
   forming a surface electrode on the drift layer in such a manner that the surface electrode is electrically coupled to the semiconductor element through the opening of the insulation film;
   forming a passivation film above the drift layer around the periphery of the cell region to cover an outer edge of the surface electrode, the forming the passivation film including forming an opening to the passivation film in such a manner that the surface electrode is exposed outside through the opening of the passivation film; and
   forming a back electrode on a back surface of the substrate in such a manner that the back electrode is electrically coupled to the semiconductor element, the back surface of the substrate being opposite to the front surface of the substrate, wherein
   the forming the passivation film further includes forming an uneven surface in a front side of the passivation film in such a manner that the uneven surface has a shape independent of a shape of a surface underlying the passivation film, and
   a length from an inner edge of the opening of the passivation film to the chip edge measured along the uneven surface of the front side of the passivation film is greater than a length from the inner edge of the opening of the passivation film to the chip edge measured along a back side of the passivation film, the back side of the passivation film being placed on the surface underlying the passivation film so that the back side has a shape dependent on the surface underlying the passivation film, wherein
   the forming the passivation film further includes forming a first film layer in such a manner that the first film layer has the shape dependent of the shape of the underlying surface of the passivation film, the forming the passivation film further including forming a second film layer on the first film layer, the first and second film layers being formed from different materials, and
   the forming the second film layer includes forming the uneven surface by etching the second film layer and using the first film layer as a stopper layer.

2. The method of claim 1, wherein the forming of the uneven surface includes forming the uneven surface by etching the second film layer so that the shape of the second film layer is independent from the shape of the first film layer.

3. The method of claim 1, wherein the forming of the uneven surface includes forming the uneven surface by etching the second film layer so that the thickness of the second film layer is non-uniform and includes multiple projections and recesses that define a comb-shaped surface.

4. The method of claim 1, wherein the forming of the uneven surface includes forming the uneven surface by etching the second film layer so that the surface area of the second film layer is greater than the surface area of the first film layer.

* * * * *